United States Patent
Voutsas

(10) Patent No.: US 7,087,964 B2
(45) Date of Patent: Aug. 8, 2006

(54) PREDOMINANTLY <100> POLYCRYSTALLINE SILICON THIN FILM TRANSISTOR

(75) Inventor: Apostolos Voutsas, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 118 days.

(21) Appl. No.: 10/253,806

(22) Filed: Sep. 23, 2002

(65) Prior Publication Data

US 2003/0025134 A1 Feb. 6, 2003

Related U.S. Application Data

(62) Division of application No. 09/796,341, filed on Feb. 28, 2001, now abandoned.

(51) Int. Cl.
*H01L 21/00* (2006.01)

(52) U.S. Cl. ....................... 257/347; 257/213

(58) Field of Classification Search ........ 438/149–151, 438/487, 142, 158–166, 197, 586, 226, 44; 257/64, 72, 57, 59, 44, 45, 213, 293, 66, 257/347, 67, 348, 65, 60, 61, 62, 63, 350, 257/354, 344, 351–353, 628
See application file for complete search history.

(56) References Cited

U.S. PATENT DOCUMENTS

| | | | | |
|---|---|---|---|---|
| 3,821,783 A * | 6/1974 | Sugita et al. ............... 257/628 |
| 4,654,958 A * | 4/1987 | Baerg et al. ................ 438/226 |
| 4,693,759 A * | 9/1987 | Noguchi et al. ............. 117/8 |
| 4,773,964 A * | 9/1988 | Haond ......................... 117/45 |
| 5,084,410 A * | 1/1992 | Eguchi et al. ............... 438/44 |
| 5,177,578 A * | 1/1993 | Kakinoki et al. ............ 257/64 |
| 5,286,673 A * | 2/1994 | Nishihara ................... 438/401 |
| 5,485,028 A * | 1/1996 | Takahashi et al. .......... 257/347 |
| 5,943,560 A * | 8/1999 | Chang et al. ............... 438/151 |
| 6,020,224 A * | 2/2000 | Shimogaichi et al. ....... 438/158 |
| 6,108,464 A * | 8/2000 | Foresi et al. ................. 385/14 |
| 6,190,949 B1 * | 2/2001 | Noguchi et al. ............ 438/149 |
| 6,198,132 B1 * | 3/2001 | Ishida et al. ................ 257/347 |
| 6,274,888 B1 * | 8/2001 | Suzuki et al. ................ 257/72 |
| 6,478,263 B1 * | 11/2002 | Yamazaki et al. .......... 257/347 |
| 6,501,095 B1 * | 12/2002 | Yamaguchi et al. ......... 257/57 |
| 6,506,669 B1 * | 1/2003 | Kuramasu et al. .......... 438/586 |
| 6,534,353 B1 * | 3/2003 | Kuramasu et al. .......... 438/197 |
| 6,569,720 B1 * | 5/2003 | Kunii ......................... 438/151 |
| 6,653,179 B1 * | 11/2003 | Minegishi et al. .......... 438/166 |
| 6,657,227 B1 * | 12/2003 | Tamura et al. ............... 257/64 |
| 6,664,147 B1 * | 12/2003 | Voutsas ...................... 438/150 |
| 6,686,978 B1 * | 2/2004 | Voutsas ........................ 349/44 |
| 2002/0117718 A1 * | 8/2002 | Voutsas ...................... 257/347 |
| 2002/0118317 A1 * | 8/2002 | Voutsas ........................ 349/43 |
| 2003/0025134 A1 * | 2/2003 | Voutsas ...................... 257/213 |
| 2003/0064551 A1 * | 4/2003 | Voutsas ...................... 438/150 |

* cited by examiner

*Primary Examiner*—Laura M. Schillinger
(74) *Attorney, Agent, or Firm*—David C. Ripma

(57) ABSTRACT

A method is provided to produce thin film transistors (TFTs) on polycrystalline films having a single predominant crystal orientation. A layer of amorphous silicon is deposited over a substrate to a thickness suitable for producing a desired crystal orientation. Lateral-seeded excimer laser annealing (LS-ELA) is used to crystallize the amorphous silicon to form a film with a preferred crystal orientation. A gate is formed overlying the polycrystalline film. The polycrystalline film is doped to produce source and drain regions.

7 Claims, 4 Drawing Sheets

US 7,087,964 B2

PREDOMINANTLY <100> POLYCRYSTALLINE SILICON THIN FILM TRANSISTOR

CROSS REFERENCE TO RELATED APPLICATIONS

This application is a divisional of application Ser. No. 09/796,341, filed Feb. 28, 2001, entitled "Method of Forming Predominantly <100> Polycrystalline Silicon Thin Film Transistors," invented by Apostolos Voutsas, now Abandoned.

BACKGROUND OF THE INVENTION

This invention relates generally to semiconductor technology and more particularly to the method of forming thin film transistors (TFTs) on polycrystalline silicon regions within an amorphous silicon film.

Polycrystalline silicon is formed by crystallizing amorphous silicon films. One method of crystallizing amorphous silicon films is excimer laser annealing (ELA). Conventional ELA processes form polycrystalline films having a random polycrystalline structure. Random, as used here, means that no single crystal orientation is dominant and that polycrystalline structures consist of a mixture of crystallographic orientations in silicon. These crystallographic orientations in silicon are commonly denoted as <111>, <110>, and <100>, along with their respective corollaries, as is well known in the art. Control of crystallographic orientation is generally desirable because the electrical characteristics of a polycrystalline silicon film depend upon the crystallographic orientation of the film. In addition, the uniformity of the electrical characteristics will improve if the majority of the film has a controllable texture.

ELA, as well as many other annealing methods, has not provided a means to control these microstructural characteristics and achieve a predictable and repeatable preferential crystal orientation and film texture within an annealed film. It would be desirable to have a method of producing TFTs using a polycrystalline silicon film with a more uniform crystallographic orientation. It would also be desirable to be able to produce TFTs using predominantly <100> polycrystalline silicon.

SUMMARY OF THE INVENTION

Accordingly, a method of forming thin film transistor (TFT) structures on a substrate, which has a polycrystalline silicon film with a desired predominant crystal orientation, is provided. The method of forming the TFTs comprises the steps of: providing a substrate, depositing an amorphous silicon film on the substrate, annealing the substrate to produce a polycrystalline film with the desired predominant crystal orientation, preferably a <100> crystal orientation, forming a gate structure over the polycrystalline film; and doping the polycrystalline film to produce source regions and drain regions.

The substrate can be any material that is compatible with the deposition of amorphous silicon and excimer laser annealing. For display applications, the substrate is preferably a transparent substrate such as quartz, glass or plastic.

To achieve a good quality film that is predominantly <100> crystal orientation, the step of depositing the amorphous film should deposit to a thickness of at least approximately 100 nm.

The step of annealing preferably uses a laterally seeded excimer laser annealing process.

The method of the present invention, produces a thin film transistor structure comprising a polycrystalline film, which has a predominantly <100> crystal orientation, overlying a substrate. The final film is at least 100 nm thick. A gate structure overlies the polycrystalline silicon film and source/drain regions are formed by doping the polycrystalline silicon film.

DETAILED DESCRIPTION OF THE INVENTION

Figure 1:
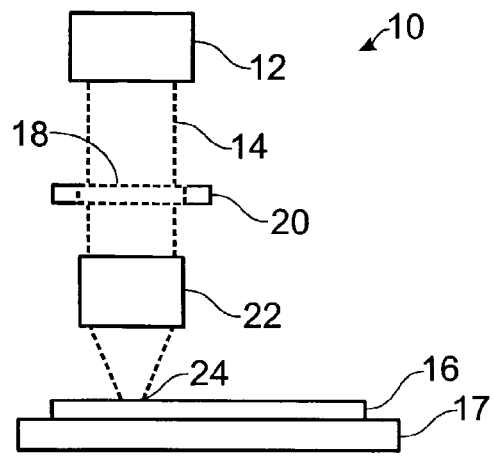
FIG. 1 is a schematic cross-sectional view showing an excimer laser anneal (ELA) apparatus used in connection with the present method.

Referring to FIG. 1 a lateral-seeded excimer laser annealing (LS-ELA) apparatus 10 is shown. LS-ELA apparatus 10 has a laser source 12. Laser source 12 includes a laser (not shown) along with optics, including mirrors and lens, which shape a laser beam 14 (shown by dotted lines) and direct it toward a substrate 16, which is supported by a stage 17. The laser beam 14 passes through a mask 18 supported by a mask holder 20. The laser beam 14 preferably has an output energy in the range of 0.8 to 1 Joule when the mask 18 is 50 mm×50 mm. Currently available commercial lasers such as Lambda Steel 1000 can achieve this output. As the power of available lasers increases, the energy of the laser beam 14 will be able to be higher, and the mask size will be able to increase as well. After passing through the mask 18, the laser beam 14 passes through demagnification optics 22 (shown schematically). The demagnification optics 22 reduce the size of the laser beam reducing the size of any image produced after passing through the mask 18, and simultaneously increasing the intensity of the optical energy striking the substrate 16 at a desired location 24. The demagnification is typically on the order of between 3× and 7× reduction, preferably a 5× reduction, in image size. For a 5× reduction the image of the mask 18 striking the surface at the location 24 has 25 times less total area than the mask, correspondingly increasing the energy density of the laser beam 14 at the location 24.

The stage 17 is preferably a precision x-y stage that can accurately position the substrate 16 under the beam 14. The stage 17 is preferably capable of motion along the z-axis, enabling it to move up and down to assist in focusing or defocusing the image of the mask 18 produced by the laser beam 14 at the location 24. The mask holder 20 is also capable of x-y movement.

Figure 2:
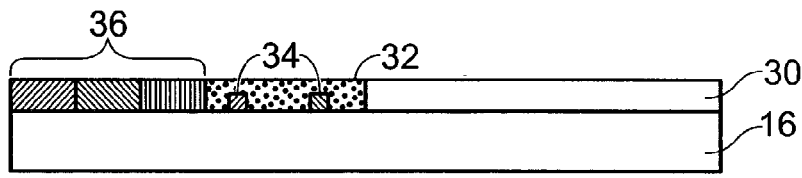
FIG. 2 (prior art) is a cross-sectional view showing polycrystalline film crystallized using an interface-seeded ELA (IS-ELA) process

FIG. 2 illustrates aspects of a prior art ELA process. This process is sometimes referred to as Interface-Seeded ELA (IS-ELA). An amorphous silicon film 30 has been deposited over the substrate 16. A laser pulse is directed at the amorphous silicon film 30, which melts and crystallizes a region 32. The laser pulse melts a region on the order of 0.5 mm. Small microcrystalline seeds 34 remain, or form, at the interface. As the surrounding amorphous silicon crystallizes these seeds affect the crystal orientation. Since the seeds 34 have a variety of crystal orientations, the resulting films will accordingly have a wide mix of crystal orientations. This is illustrated by previously crystallized region 36. In actuality, since a large number of seeds would be present at the interface, a large number of crystal orientations would form.

Figure 3:
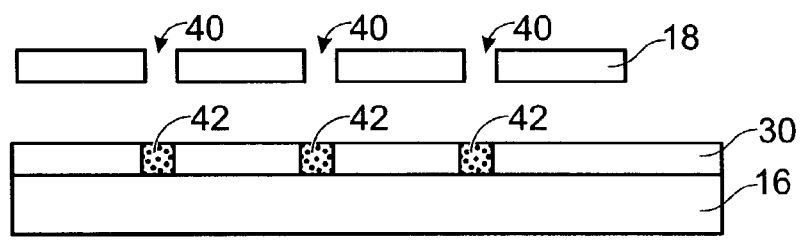
FIG. 3 illustrates a step in the process of lateral-seeded ELA (LS-ELA).
Figure 4:
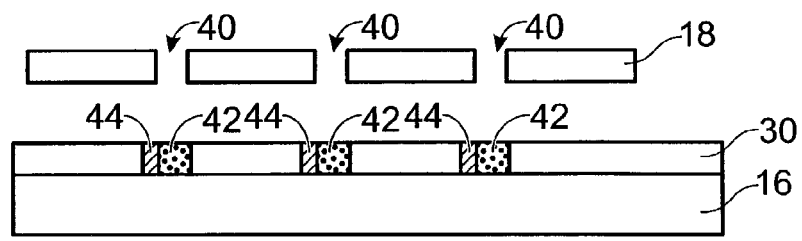
FIG. 4 illustrates a step in the process of lateral-seeded ELA (LS-ELA).
Figure 5:
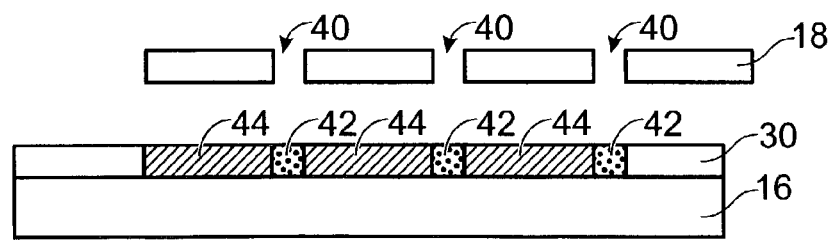
FIG. 5 illustrates a step in the process of lateral-seeded ELA (LS-ELA).

FIGS. 3 through 5 illustrate the steps of Lateral-Seeded ELA (LS-ELA), which is also referred to as Lateral-Growth ELA (LG-ELA) or Lateral Crystallization ELA (LC-ELA). Starting with FIG. 3, the amorphous silicon film 30 has been deposited over the substrate 16. A laser beam pulse has been passed through openings 40 in the mask 18 to form beamlets, which irradiate regions 42 of the amorphous silicon film 30. Each beamlet is on the order of 5 microns wide. This is approximately 100 times narrower than the 0.5 mm used in the prior art IS-ELA process. The small regions 42 are melted and crystallized by the beamlets produced by the laser pulse passing through the mask.

After each pulse the mask 18 is advanced by an amount not greater than half the lateral crystal growth distance. A subsequent pulse is then directed at the new area. By advancing the image of the openings 40 a small distance, the crystals produced by preceding steps act as seed crystals for subsequent crystallization of adjacent material. Referring now to FIG. 4, the irradiated regions 42 have moved slightly. The previously crystallized regions 44 act as the seed crystal for the crystallization of the irradiated regions 42. By repeating the process of advancing the mask laterally and firing short pulses the crystal is effectively pulled in the direction of the advancing laser pulses.

FIG. 5 shows the amorphous silicon film 30 after several additional pulses following FIG. 4. The crystals have continued to grow in the direction of the masks' movement to form a polycrystalline region. The mask will preferably advance until each opening 40 reaches the edge of a polycrystalline region formed by the opening immediately preceding it. To crystallize larger regions, the stage 17, which was described in reference to FIG. 1, can be moved, and the mask 18 repositioned, to continue crystallizing the amorphous silicon film 30 until a region of the desired size has been crystallized.

This LS-ELA process produces crystallized regions that are more uniform, due to the propagation of a first crystallized region by subsequent laser pulses, as opposed to crystallized regions formed using multiple seed crystals at the interface. FIGS. 6 through 9 are plots that illustrate the affect of amorphous silicon film thickness on the resulting predominant crystal orientation.

Figure 6:
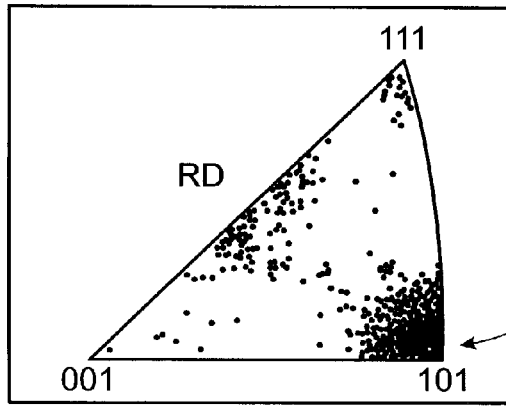
FIG. 6 is a scatter plot of crystal orientations for a 35 nm thick film.

FIG. 6 is a plot of the distribution of crystal orientation for a 30 nm thick deposited amorphous silicon film after LS-ELA processing. FIG. 6 shows that a majority of the crystals are in a 101 region 50. The 101 region 50 corresponds to a <110> crystal orientation.

Figure 7:
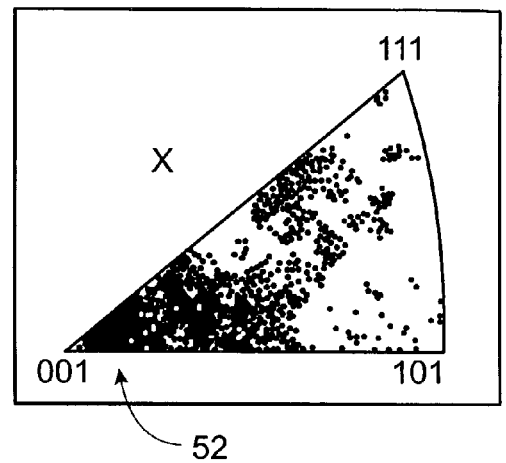
FIG. 7 is a scatter plot of crystal orientations for a 45 nm thick film.

FIG. 7 is a plot of the distribution of crystal orientation for a 45 nm thick deposited amorphous silicon film after LS-ELA processing. FIG. 7 shows that the crystal orientations are spread throughout the orientation plot. This is a less ideal condition for the resulting film. It should be noted that the predominant crystal orientation has shifted away from the <110> orientation toward the <100> orientation region 52, which corresponds to 001 on the plot.

Figure 8:
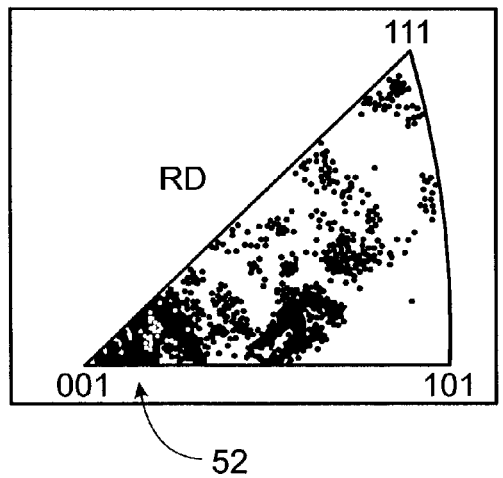
FIG. 8 is a scatter plot of crystal orientations for a 75 nm thick film.

FIG. 8 is a plot of the distribution of crystal orientation for a 75 nm thick deposited amorphous silicon film after LS-ELA processing. FIG. 8 shows that the crystal orientation has moved closer to the <100> orientation. However, the crystal orientation is still spread over a relatively wide range of crystal orientations.

Figure 9:
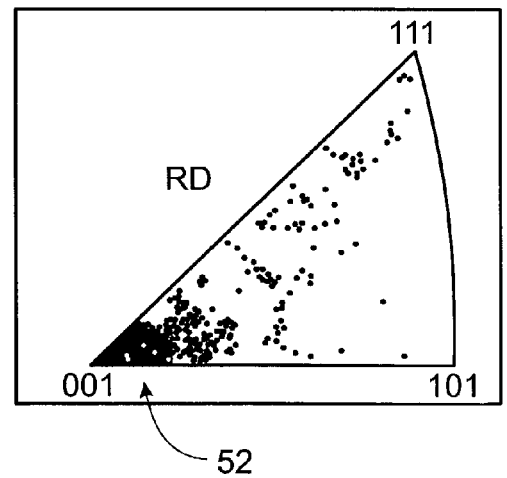
FIG. 9 is a scatter plot of crystal orientations for a 100 nm thick film.

FIG. 9 is a plot of the distribution of crystal orientation for a 100 nm thick deposited amorphous silicon film after LS-ELA processing. FIG. 9 shows that the crystal orientation is now predominantly <100> as shown by the <100> region 52.

Figure 10:
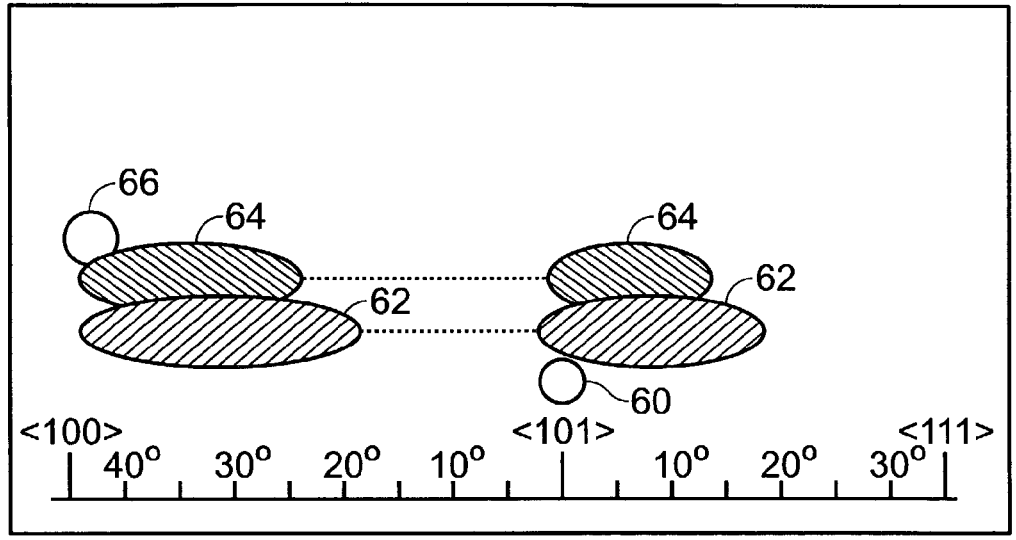
FIG. 10 is a diagram illustrating variation in crystal orientation for various film thicknesses.

FIG. 10 is a diagram illustrating variation in crystal orientation for various film thicknesses. A first thickness 60, which corresponds to an approximately 35 nm thick film, has a <110> orientation to within less than 10 degrees. A second film thickness 62, which corresponds to an approximately 45 nm thick film, has a mix of <100> orientation to within 25 degrees and <101> orientation to within approximately 20 degrees. A third film thickness 64, which corresponds to an approximately 75 nm thick film, has a mix of <100> orientation to within approximately 20 degrees and <101> orientation to within approximately 15 degrees. A forth film thickness 66, which corresponds to an approximately 100 nm thick film, has a <100> orientation to within approximately 10 degrees. As used herein, the term predominant crystal orientation, or any similar phrase, refers to a material that is within less than 15 degrees of a desired crystal orientation. Looking at FIG. 10, it is apparent that it is possible to produce films with predominantly <110> orientation, or <100> orientation. <100> orientation is generally preferred for semiconductor processes because of its electrical properties. Unfortunately, to produce predominantly <100> orientation requires the formation of thicker films than those that generally are considered desirable for the formation of thin film transistors. Thicker films tend to have greater leakage currents than thinner films. In the method of this invention, the compromise is made between leakage current and the desirable electrical properties associated with having predominantly <100> polycrystalline films. While it may be possible to polish the films to produce thinner films, this may not be practical for all applications.

Figure 11:
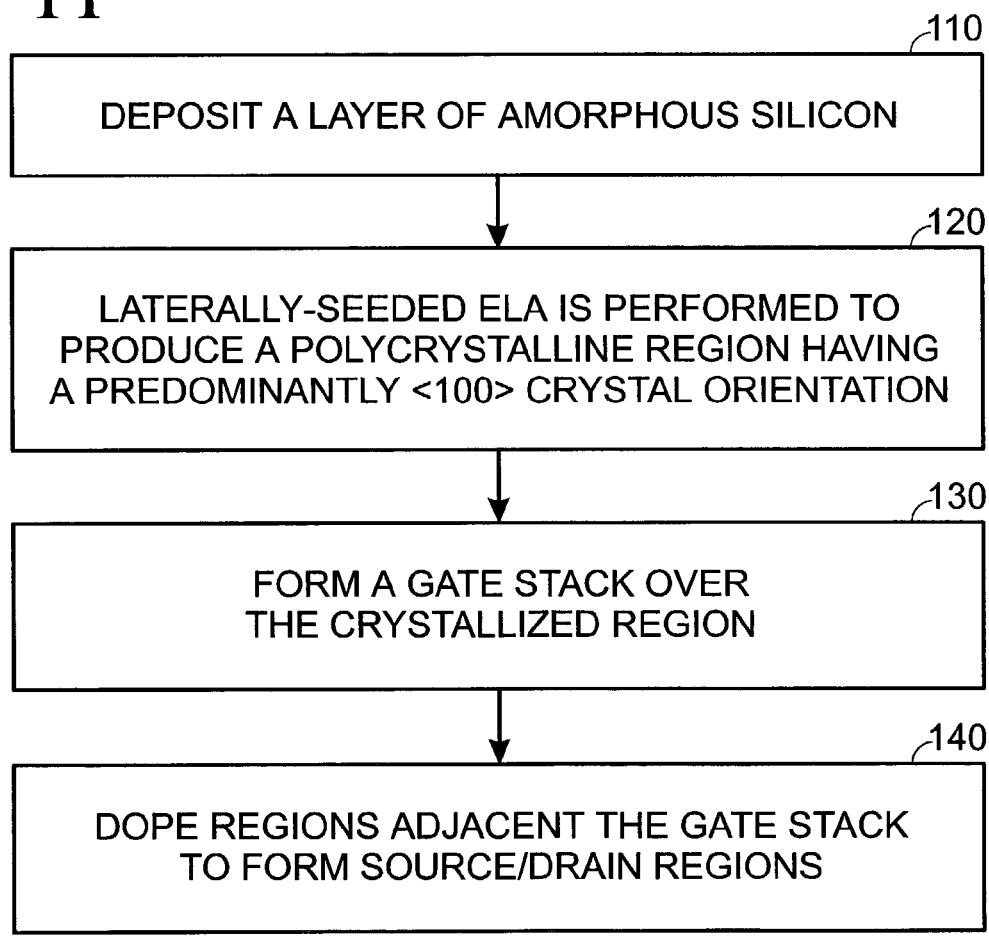
FIG. 11 is a flowchart of a process of performing the method of the present invention.

Referring now to FIG. 11, a flow chart of the steps of the method of the present invention is shown. Step 110 deposits a layer of amorphous silicon over the substrate. The layer of amorphous silicon should be thick enough to produce predominantly <100> polycrystalline silicon following subsequent processing according to the method of the present invention. The necessary thickness to produce a predominantly <100> polycrystalline material can be determined without undue experimentation. Preferably, the layer of amorphous silicon will be at least approximately 100 nm thick.

Step 120 performs lateral crystallization using LS-ELA to produce a polycrystalline region having a predominantly <100> crystal orientation. A laser beam is used to project an image of the mask onto the substrate. The laser beam energy is sufficient to cause amorphous silicon to crystallize. A sequence of laser pulses can be used to crystallize a region, as described above. The resulting polycrystalline film is predominantly <100> crystal orientation, meaning within 15 degrees of <100> crystal orientation. Preferably, the crystal orientation is within 10 degrees of <100> crystal orientation.

Step 130 forms a gate stack overlying the polycrystalline film. The gate stack includes a dielectric layer, preferably silicon dioxide, and a gate, preferably composed of polysilicon.

Step 140 dopes regions adjacent the gate stack to form n-type and p-type regions on either side of the gate stack. These doped regions are referred to as source and drain regions. The doping is accomplished by appropriately masking the area, implanting the desired dopants, and annealing. In TFT structures, the dopants preferably extend through the thickness of the polycrystalline film.

Figure 12:
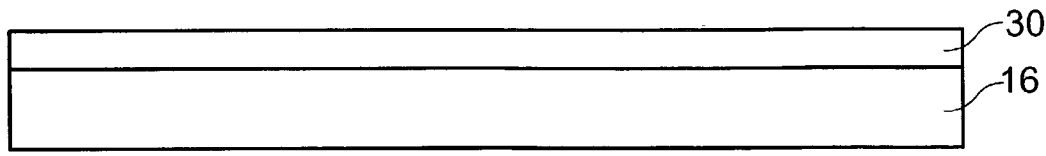
FIG. 12 is a cross-sectional view of a substrate during processing.

FIGS. 12 through 15 show the film at various stages of processing. FIG. 12 shows the substrate 16 with an overlying amorphous silicon film 30. For display applications, the substrate is preferably transparent. Available transparent substrate materials include quartz, glass, and plastic. Although it is not shown, a barrier coat may be used between the substrate and the amorphous silicon as is well known to one of ordinary skill in the art. The amorphous silicon film is preferably thick enough to form a predominantly <100> crystal orientation following LS-ELA processing. Amorphous silicon films on the order of at least approximately 100 nm will produce predominantly <100> crystal orientation. Slightly thinner films may also produce the desired result, without undue experimentation.

Figure 13:
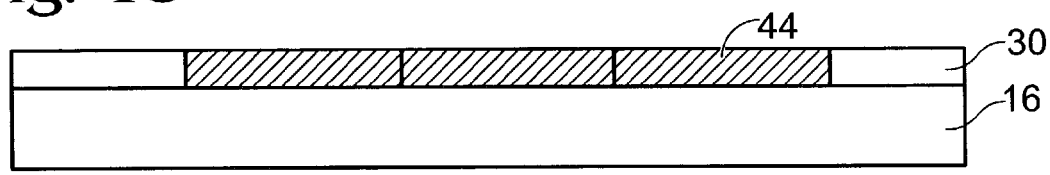
FIG. 13 is a cross-sectional view of a substrate during processing.

FIG. 13 shows a polycrystalline region 44 following the LS-ELA process, which was discussed above. The polycrystalline region 44 is predominantly <100>. By predominantly <100>, it is meant that the orientation is within 15 degrees of <100> as described above with reference to FIG. 10.

Figure 14:
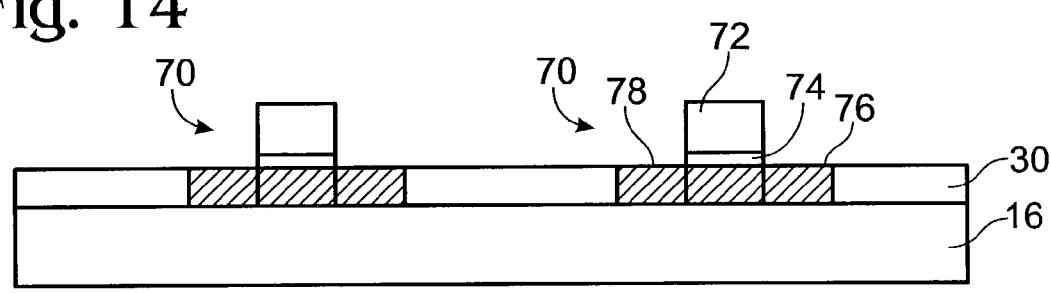
FIG. 14 is a cross-sectional view of transistor structures formed on the substrate during processing.

FIG. 14 shows TFT structures 70 formed using the polycrystalline film. A gate 72 has been formed overlying the polycrystalline film, with a dielectric layer 74 interposed between the gate and the polycrystalline film. Source region 76 and drain region 78 have been formed within the polycrystalline film by doping the polycrystalline film with n-type and p-type dopants, respectively.

The gate is preferably a polysilicon gate. The interposed dielectric layer is silicon dioxide, or other suitable dielectric material. The source and drain regions are formed by implanting, or other suitable doping method.

The polycrystalline film is removed from the substrate over areas that are not used to produce TFTs or other device elements. Elimination of the polycrystalline film from these open spaces provides isolation of device components.

Figure 15:
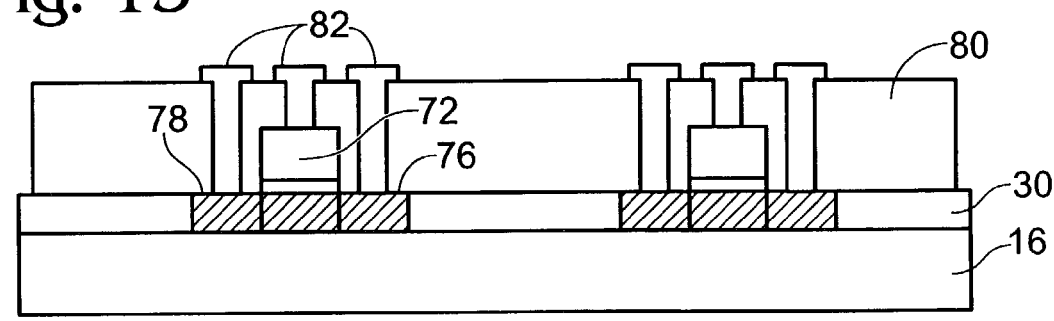
FIG. 15 is a cross-sectional view of transistor structures formed on the substrate during processing.

Referring now to FIG. 15, an isolation material 80 is provided to isolate the device components as well as the metal connections 82.

Although a simple TFT structure has been shown, many different transistor structures are known to those of ordinary skill in the art and could be used in connection with the present method. Lightly-doped drain and source regions could be used. A variety of gate structures could be used as well, including substitute gates, and new high-k dielectric materials. The invention is not limited to the specific embodiments described above, but is defined by the claims.

What is claimed is:

1. A thin film transistor (TFT) structure comprising:
    a) a substrate;
    b) a polycrystalline silicon thin-film having a thickness overlying the substrate, and a crystallographic orientation responsive to the thickness;
    c) a gate structure formed over the polycrystalline silicon thin-film; and
    d) source and drain regions formed by doping the polycrystalline silicon thin-film; and,
    wherein the polycrystalline silicon thin-film has a thickness of about 100 nm thick, and a predominantly <100> crystallographic orientation.

2. The thin film transistor structure of claim 1, wherein the substrate is transparent.

3. The thin thin transistor structure of claim 2, wherein the substrate is quartz, glass, or plastic.

4. The thin film transistor structure of claim 1, wherein the polycrystalline silicon thin-film is in the range of between approximately 100 and 250 nm thick.

5. The thin film transistor structure of claim 1, wherein the source and drain regions extend only partially through the polycrystalline silicon thin-film.

6. The thin film transistor structure of claim 1, wherein the crystallographic orientation is within 10 degrees of <100> crystal orientation.

7. The thin film transistor structure of claim 1, wherein the crystallographic orientation is within 15 degrees of <100> crystal orientation.

\* \* \* \* \*